United States Patent
Hasegawa et al.

(10) Patent No.: US 7,518,412 B2
(45) Date of Patent: Apr. 14, 2009

(54) OUTPUT CIRCUIT HAVING SHORT RISE TIME AND SMALL CONSUMPTION CURRENT

(75) Inventors: Hideaki Hasegawa, Tokyo (JP); Takashi Honda, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 51 days.

(21) Appl. No.: 11/594,215

(22) Filed: Nov. 8, 2006

(65) Prior Publication Data
US 2007/0132498 A1    Jun. 14, 2007

(30) Foreign Application Priority Data
Dec. 13, 2005    (JP) .............................. 2005-359203

(51) Int. Cl.
*H03K 5/22* (2006.01)
(52) U.S. Cl. .............................. 327/66; 327/67; 327/333
(58) Field of Classification Search .................. 327/66, 327/67, 333
See application file for complete search history.

(56) References Cited

U.S. PATENT DOCUMENTS

| 5,675,278 A | 10/1997 | Tanaka et al. | |
|---|---|---|---|
| 7,196,568 B2* | 3/2007 | Kawasaki et al. | ........... 327/333 |
| 7,205,819 B2* | 4/2007 | Davis | ......................... 327/333 |

FOREIGN PATENT DOCUMENTS

JP    07-226669    8/1995

* cited by examiner

*Primary Examiner*—Kenneth B. Wells
(74) *Attorney, Agent, or Firm*—Volentine & Whitt, P.L.L.C.

(57) ABSTRACT

A current mirror circuit includes p-type MOS (PMOS) transistors, whereby the current flowing when the input voltage is "H" is interrupted when an output node of the current mirror circuit goes from "L" to "H," so that a cascode-connected PMOS transistor within the current mirror circuit is automatically turned OFF. The gates of PMOS transistors within the current mirror circuit are connected by a signal line directly to the output node. The rise time of the output voltage of the current mirror circuit and the consumption current can thus be reduced.

20 Claims, 16 Drawing Sheets

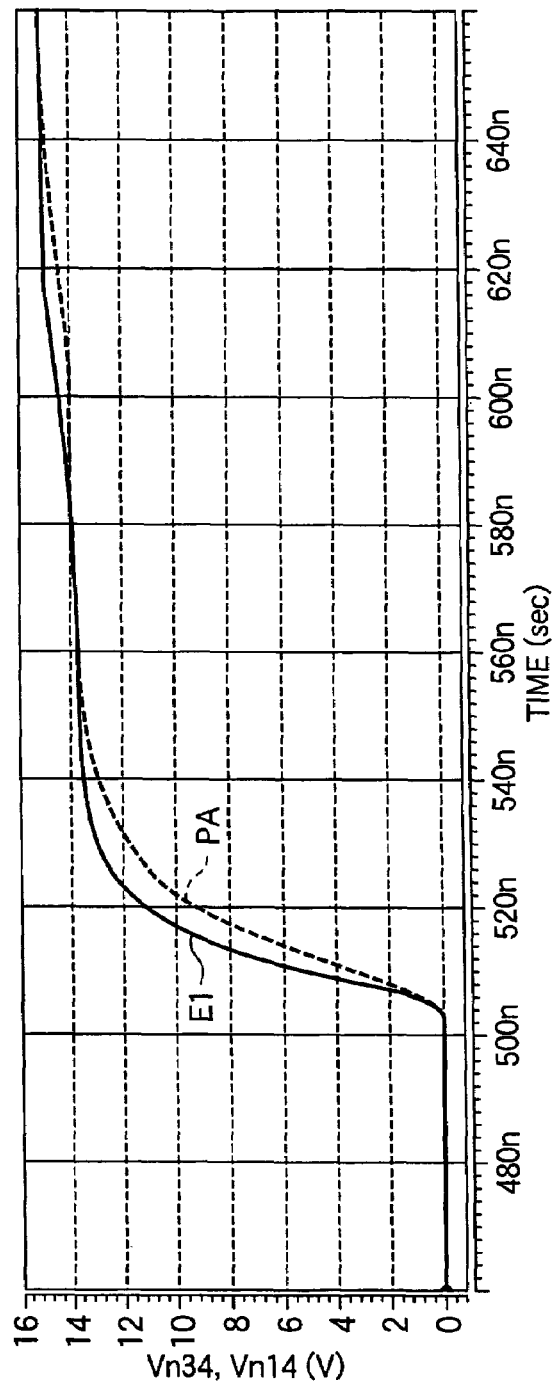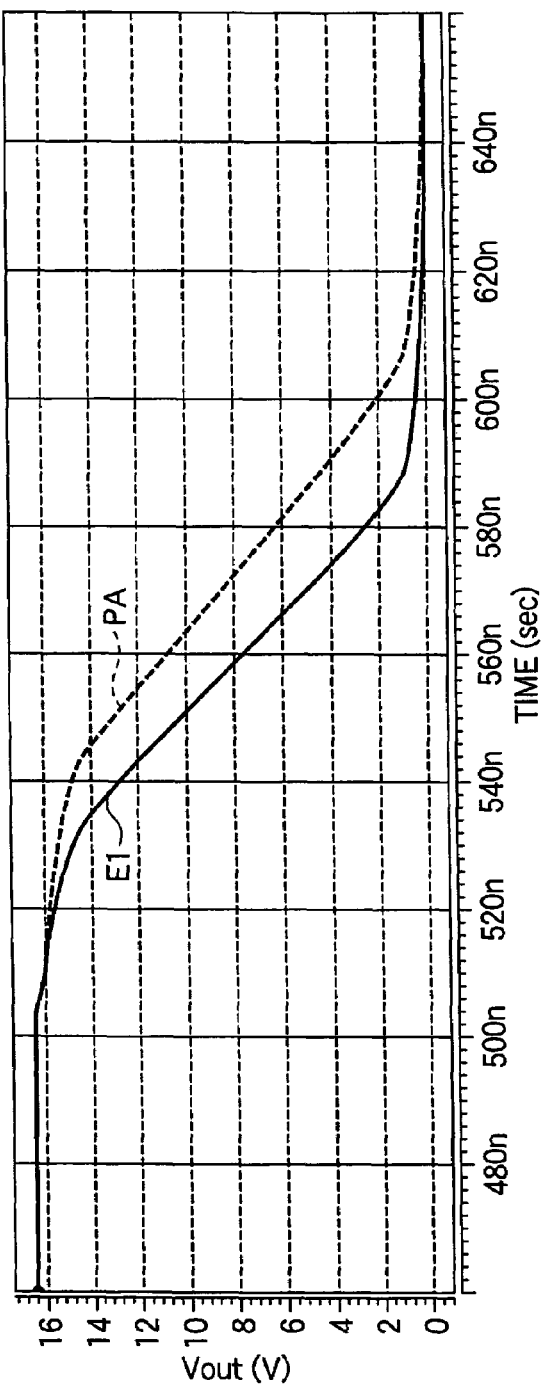

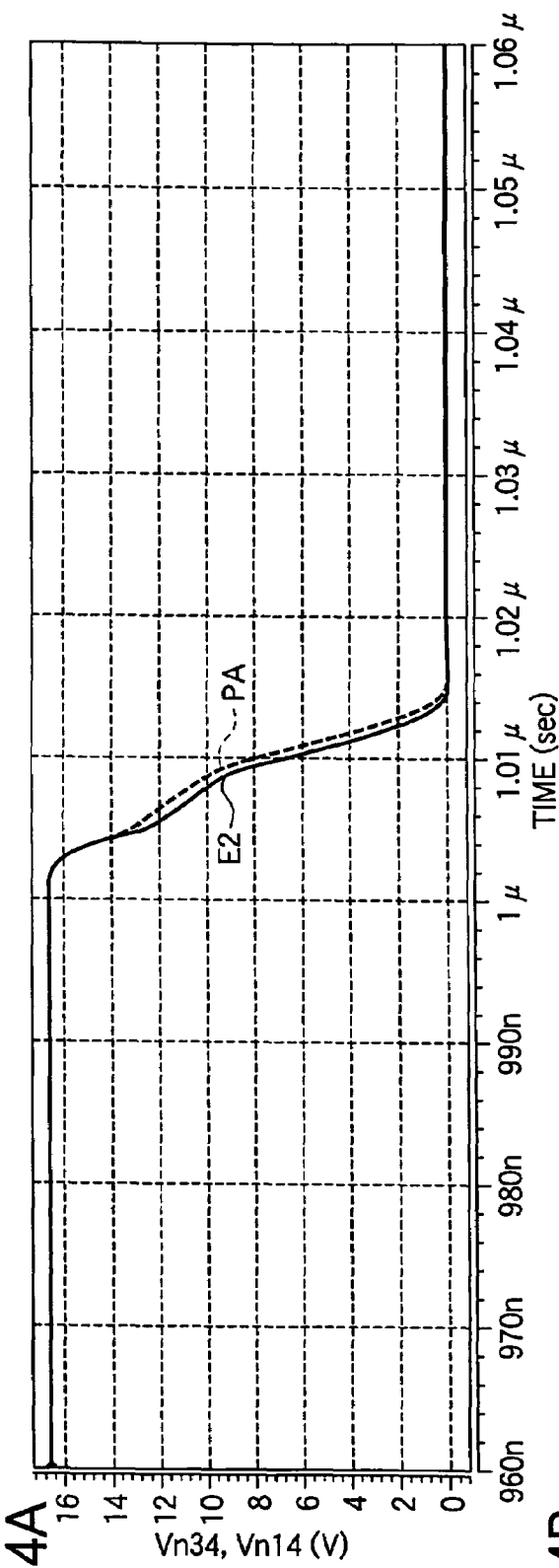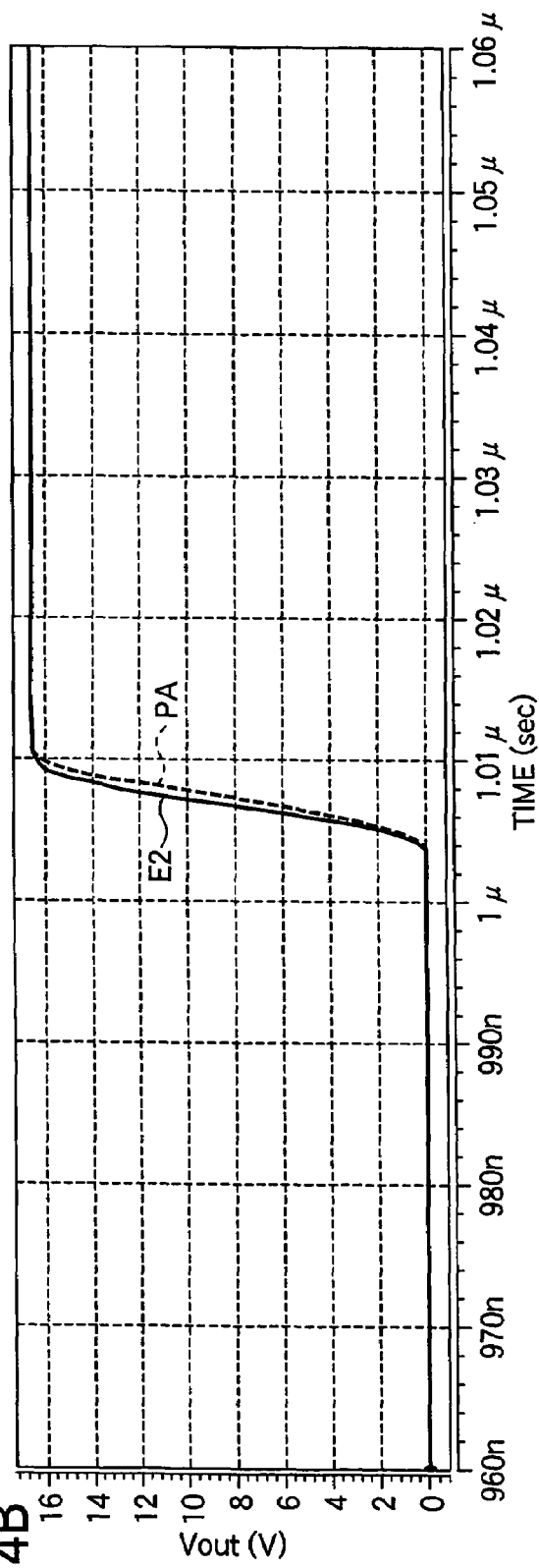

OUTPUT CIRCUIT HAVING SHORT RISE TIME AND SMALL CONSUMPTION CURRENT

BACKGROUND OF THE INVENTION

1. Field of the Invention

The present invention relates to an output circuit, such as a level shifter for converting an input signal to a signal of a different level.

2. Description of the Related Art

An example of prior-art output circuit for converting an input signal to a signal of a different voltage level is shown in Japanese Patent Kokai Publication No. H07-226669.

FIG. 15 shows a conventional output circuit shown in FIG. 1 of the above-mentioned publication.

The output circuit shown in FIG. 15 is a level shifter for converting an input voltage to a different voltage level, and includes a Wilson current mirror circuit 10 connected between a power supply potential VDDH node, and nodes N12 and N14. The current mirror circuit 10 is formed of four P-channel MOS transistors (hereinafter denoted by "PMOS's") 11, 12, 13 and 14. The source of the PMOS 11 is connected to a power supply potential VDDH (e.g., 15V) node, and the drain of the PMOS 11 is connected to a node N11, which in turn is connected to the source of the PMOS 12, and the drain and the gate of the PMOS 12 are connected to a node N12.

The source of the PMOS 13 is connected to the power supply potential VDDH node, and the drain and the gate of the PMOS 13 are connected to the gate of the PMOS 11, and a node N13, which in turn is connected to the source of the PMOS 14. The drain of the PMOS 14 is connected to a node N14.

In the Wilson current mirror circuit 10, the current ratio between the path comprising the PMOS's 11 and 12, and the path comprising PMOS's 13 and 14 is determined based on the β ratios (β=W/L, where W represents the gate width of the MOS transistor, and L represents the gate length of the MOS transistor).

Connected to the node N12 is the drain of an N-channel MOS transistor (hereinafter denoted by "NMOS") 15 for inducing a current in the current mirror circuit 10. The gate of the NMOS 15 is connected to an inverted input terminal XIN for input of an inverted input voltage Vxin. The source of the NMOS 15 is connected to a ground potential VSS node.

Connected to the node N14 is the drain of an NMOS 16, and the gate of the NMOS 16 is connected to a non-inverted input terminal IN for input of a non-inverted input voltage Vin. The source of the NMOS 16 is connected to the ground potential VSS node.

Connected to the node N14 and the inverted input terminal XIN is an output stage 20, which is formed of a PMOS 21 and an NMOS 22. The source of the PMOS 21 is connected to the power supply potential VDDH node, and the gate of the PMOS 21 is connected to the node N14, and the drain of the PMOS 21 is connected to an output node N21. The output node N21 is connected to the output terminal OUT for an output voltage Vout, and the drain of the NMOS 22. The gate of the NMOS 22 is connected to the inverted input terminal XIN, and the source of the NMOS 22 is connected to the ground potential VSS node.

The operation of the circuit is as follows.

For instance, when the non-inverted input voltage Vin is raised from a low potential level (hereinafter denoted by "L") to a high potential level (hereinafter denoted by "H") of a power supply potential VCC (e.g., 5V), and the inverted input voltage Vxin, which is complementary to the non-inverted input voltage Vin, is lowered from "H" to "L," the NMOS 16 is turned ON (conductive), while the NMOS's 15 and 22 are turned OFF (non-conductive). When the NMOS 16 is turned ON, the node N14 is lowered to "L" of the ground potential VSS, and the PMOS 21 is turned ON. The node N21 is raised to "H" of the power supply potential VDDH (=15V). Thus, the 5V input voltage Vin is converted to 15V power supply potential VDDH. The output voltage Vout is output via the output terminal OUT.

When the NMOS 15 is turned OFF, the current mirror circuit 10 is turned OFF, and the power supply from the power supply potential VDDH to the node N14 is interrupted. As a result, the lowering of the potential at the node N14 is accelerated, and the output terminal OUT is securely maintained at the power supply potential VDDH level.

When the non-inverted input voltage Vin is lowered from "H" to "L" and the inverted input voltage Vxin is raised from "L" to "H," the NMOS 16 is switched from ON to OFF, while the NMOS's 15 and 22 are switched from OFF to ON. When the NMOS 22 is turned ON, the output node N21 is pulled down to "L" of the ground potential VSS, and the 0V input voltage Vin is output as the output voltage Vout. When the NMOS 15 is turned ON, the current mirror circuit 10 is turned ON, the current flows through the PMOS's 11 to 14, and the potential at the node N14 is pulled up toward the power supply potential VDDH, and is supplied to the gate of the PMOS 21. The PMOS 21 is thereby kept securely in the OFF state, and the power supply from the power supply potential VDDH to the output node N21 is interrupted, and the lowering of the potential at the output node N21 is accelerated, and the output voltage Vout is kept securely at "L" of the ground potential VSS.

When the potential of the node N14 is raised to the vicinity of the power supply potential VDDH level, the potential at the node N13 also rises to the vicinity of the power supply potential VDDH level, and the gate-source voltage Vgs of the PMOS 13 is reduced, and the PMOS 13 is turned into the cut-off state. As a result, the current through the PMOS's 11 and 12 ceases to flow. Thus, the current flowing through the current mirror circuit 10 is only a transient current, and no DC current flows.

As has been described, the output circuit shown in FIG. 15 includes the current mirror circuit 10 that is connected between the node N14 and the power supply potential VDDH node, and the current mirror circuit 10 is controlled by the NMOS 15 which is turned ON and OFF by the inverted input voltage Vxin, so that the operation speed is high, and problems due to the load capacitance associated with the output terminal OUT (the problems that the switching speed, the consumption current, and other characteristics vary depending on the load capacitance associated with the output terminal OUT) can be avoided. Moreover, the operation speed is high, and the time taken for the switching is short, so that the through current flowing from the power supply potential VDDH to the ground potential VSS, which occurs when the PMOS 21 and the NMOS 22 are simultaneously ON is small, and the consumption current is small.

FIG. 16 shows another conventional output circuit shown in FIG. 3 in the above-mentioned publication.

In the output circuit shown in FIG. 16, a PMOS 17 is connected in parallel with the series connection of PMOS's 13 and 14 forming the current mirror circuit 10 identical to that shown in FIG. 15, and the output voltage Vout is fed back to the gate of the PMOS 17, so that when the output voltage Vout is at the ground potential VSS level, the node N14 fully swings to the power supply potential VDDH level. In the output circuit of FIG. 15, when the potential Vn14 at the node N14 is controlled to hold the power supply potential VDDH level, it does not actually reach VDDH, but assumes a value satisfying:

$$VDDH-Vtp \leq Vn14 \leq VDDH,$$

(where Vtp is the threshold voltage of the PMOS), so that the potential Vn14 does not fully swing. In contrast, by the addition of the PMOS 17 in FIG. 16, the potential Vn14 at the node N14 can be made to fully swing to the power supply potential VDDH level, and more secure operation can be realized.

In the conventional output circuits of FIGS. 15 and 16, when the inverted input voltage Vxin rises from "L" to "H," the NMOS 15 is turned ON, and the current mirror circuit 10 is turned ON, and the current flows through the PMOS's 11-14, and the potential at the node N14 is pulled up toward the power supply potential VDDH, and is supplied to the gate of the PMOS 21.

The node N14 is supplied with the power supply current through the PMOS's 13 and 14, and is pulled up toward the power supply potential VDDH, but this pulling-up is slow. Moreover, because of the delay in the pulling-up, the transition of the PMOS 21 to the OFF state is delayed, and the consumption current flowing through the PMOS 21 is large, and as a result, the consumption current of the output circuit as a whole is large.

SUMMARY OF THE INVENTION

An object of the invention is to realize an output circuit with a shorter rise time, and a smaller consumption current.

According to the invention, there is provided an output circuit comprising a current mirror circuit comprising:

a first circuit having a first and a second transistors connected in series between a first power supply potential node set at a first power supply potential level, and a first node;

said first transistor being so connected that its conduction state is controlled by a potential at a second node for output; and a second circuit having a third and a fourth transistors connected in series between said first power supply potential node, and said second node;

said second transistor being so connected that its conduction state is controlled by a potential at said first node, said third transistor is so connected that its conduction state is controlled by a potential at said second node, and said fourth transistor is so connected that its conduction state is controlled by a potential at said first node.

According to the invention, the rise time of the second node can be made shorter, and the consumption current in the output circuit can be reduced.

BRIEF DESCRIPTION OF THE DRAWINGS

FIGS. 5A, 5B, 6A, 6B, 7A and 7B are waveform diagrams showing the results of simulation of the output circuits of FIGS. 3 and 4;

FIGS. 12A, 12B, 13A, 13B, 14A and 14B are waveform diagrams showing the results of simulation of the output circuits of FIGS. 10 and 11;

DETAILED DESCRIPTION OF THE PREFERRED EMBODIMENTS

Embodiment 1

Figure 1:
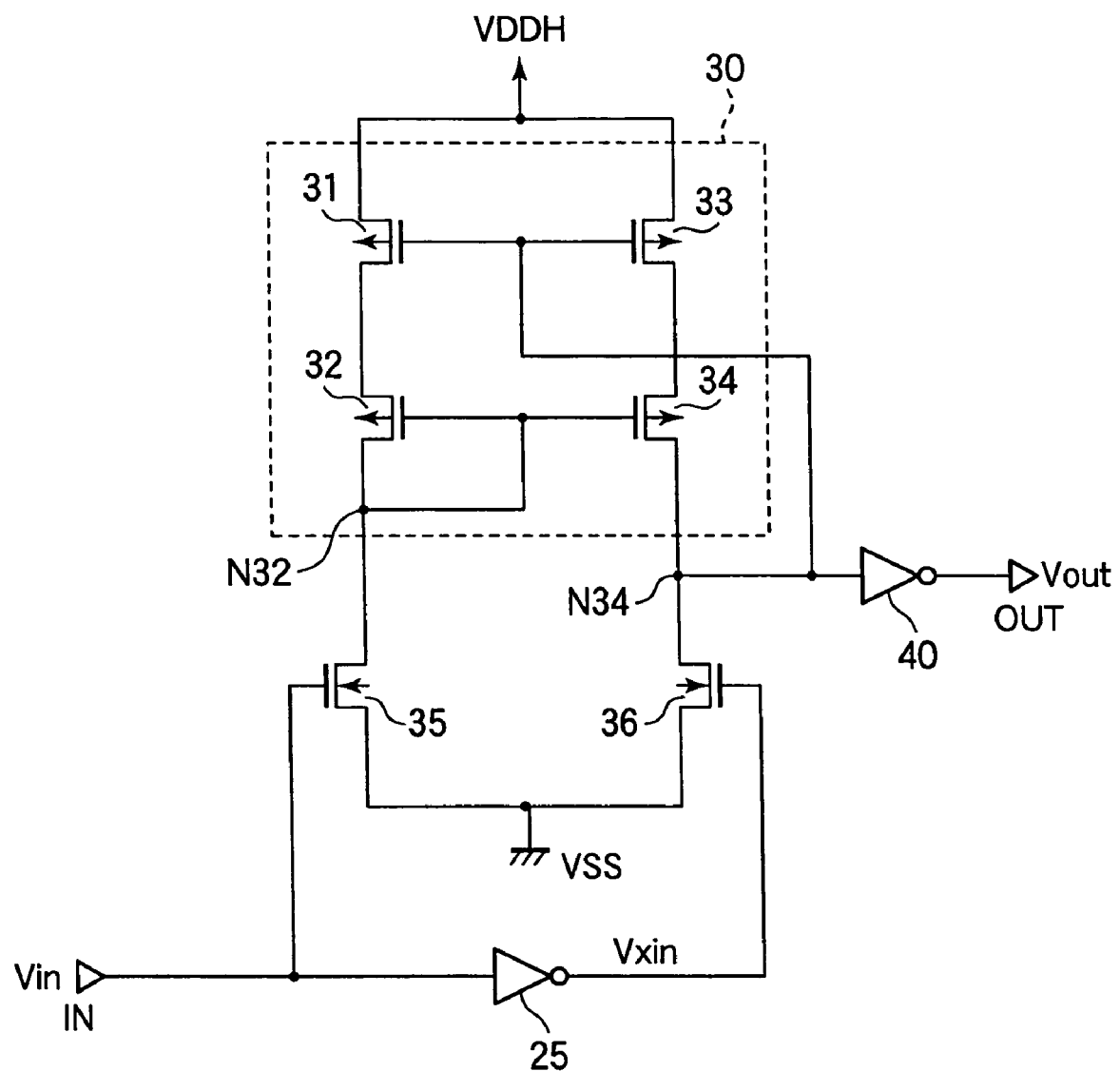
FIG. 1 is a circuit diagram showing an output circuit of Embodiment 1 of the present invention.

FIG. 1 shows an output circuit according to Embodiment 1 of the present invention.

Figure 15:
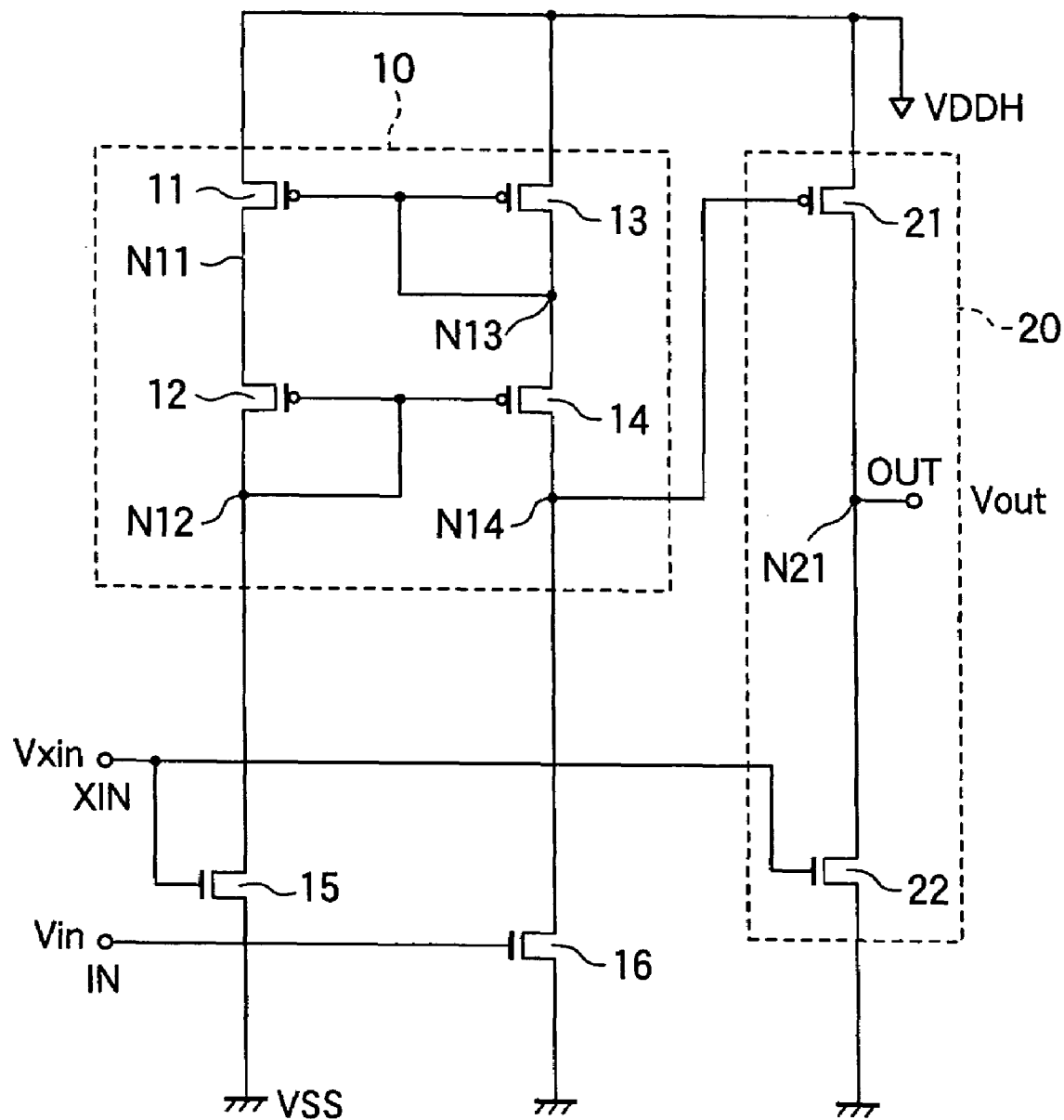
FIG. 15 is a circuit diagram showing a conventional output circuit.

Like the circuit shown in FIG. 15, the illustrated output circuit is a level shifter for converting an input signal (e.g. input voltage) which assumes a first logic level (e.g., "H") of a first signal level (e.g., 5 V) or a second logic level (e.g., of "L") of 0 V, to a signal of a different signal level (different voltage level) which assume 15 V or 0V. The output circuit comprises an inverter 25 responsive to a first input-signal (e.g., a non-inverted input voltage) Vin input at an input terminal IN, and generating a second input signal (e.g., an inverted input voltage) Vxin complementary to the first input signal, and a current mirror circuit 30 connected between a power supply potential (e.g., VDDH) node, a first node N32, and a second node N34. The current mirror circuit 30 comprises four transistors, i.e., first, second, third and fourth transistors (e.g., PMOS's) 31, 32, 33 and 34. The PMOS's 31 and 32 (first and second transistors) in combination form a first circuit, and the PMOS's 33 and 34 (third and fourth transistors) in combination form a second circuit.

The source of the PMOS 31 is connected to the power supply potential VDDH (e.g., 16V) node. The source of the PMOS 32 is connected to the drain of the PMOS 31, and the drain and the gate of the PMOS 32 are connected to the node N32. The source of the PMOS 33 is connected to the power supply potential VDDH node, and the gate of the PMOS 33 is connected to the gate of the PMOS 31. The source of the PMOS 34 is connected to the drain of the PMOS 33, and the gate of the PMOS 34 is connected to the gate of the PMOS 32, and the drain of the PMOS 34 is connected to the node N34.

The source, the drain and the gate of each of the PMOS's 31-34 respectively constitute a first main electrode, a second main electrode, and a control electrode. Conduction state of each of the PMOS's 31 to 34 is controlled by the signal or voltage applied to its gate.

In Embodiment 1, the gates of the PMOS's 31 and 33 are directly connected via a signal line SL to the node 34, unlike the conventional circuit of FIG. 15.

Connected to the node N32 is the drain of an NMOS (fifth transistor) 35 which induces a current through the current mirror circuit 30. The gate of the NMOS 35 is connected to the input terminal IN, and the source of the NMOS 35 is connected to the ground potential (second power supply potential) VSS (=0V) node. Connected to the node N34 is the drain of an NMOS 36 (sixth transistor), and the gate of the NMOS 36 is connected to the output terminal of the inverter 25, and the source of the NMOS 36 is connected to the ground potential VSS node. The NMOS's 35 and 36 in combination form a control means.

Connected to the node N34 is an input terminal of a buffer (e.g., inverter) 40 in the output stage. An output terminal of the inverter 40 is connected to the output terminal OUT for the output signal (e.g., output voltage) Vout.

The operation of the circuit shown in FIG. 1 will now be described with reference to the timing chart of FIGS. 2A to 2E.

When, as at time point t0 in FIGS. 2A to 2E, the input voltage Vin is at "L," the NMOS 35 is in the OFF (non-conductive) state, while the NMOS 36 is in the ON (conductive) state, so that the current mirror circuit 30 is in the OFF state. When the NMOS 36 is ON, the node N34 is pulled down toward the ground potential VSS, to assume "L," so that the PMOS's 31 and 33 are ON. And because the NMOS 35 is OFF, the node N32 is charged from the power supply potential VDDH, through the PMOS's 31 and 32, to rise to "H." The PMOS's 32 and 34 are therefore turned OFF (after the charging of the node N32 toward VDDH), and the current which flows from the power supply potential VDDH, through the PMOS's 33 and 34, and the NMOS 36, to the ground potential VSS, is interrupted.

When, as at time point t2 in FIGS. 2A to 2E, the input voltage Vin starts to rise from "L," the node N32 is at the "H" level (because of the charging just described), so that the PMOS's 32 and 34 are in the OFF state, and the node N34 is at the "L" level, so that the PMOS's 31 and 33 are in the ON state. From this state, the NMOS 35 is changed from OFF to ON, so that the node N32 is pulled down toward the ground potential VSS, and is thus changed from "H" to "L," and the PMOS's 32 and 34 are turned ON. Then, a current flows from the power supply potential VDDH node, through the PMOS's 31 and 32, and the NMOS 35, to the ground potential VSS node.

The NMOS 36, being controlled by the inverted input voltage Vxin output from the inverter 25 receiving the non-inverted input voltage Vin, is changed from ON to OFF, and as the PMOS's 33 and 34 are ON, the node N34 is pulled up toward the power supply potential VDDH, and is thus changed from "L" to "H." As the node N34 is changed to "H," the PMOS's 31 and 33 are changed from ON to OFF, and the current flowing from the power supply potential VDDH node, through the PMOS's 31 and 32, and the NMOS 35, to the ground potential VSS node, is interrupted.

When, as at time point t4 in FIGS. 2A to 2E, the input voltage Vin starts to fall from "H," the node N32 is at the "L" level, so that the PMOS's 32 and 34 are in the ON state, and the node N34 are at the "H" level, so that the PMOS's 31 and 33 are in the OFF state. From this state, the NMOS 36, whose input is changed from "L" to "H," is changed from OFF to ON, so that the node N34 is pulled down toward the ground potential VSS, and is thus changed from "H" to "L," and after the node N34 has fallen to "L," the PMOS's 31 and 33 are turned ON. Then, a current flows flowing from the power supply potential VDDH node, through the PMOS's 33 and 34, and the NMOS 36, to the ground potential VSS node.

When the input voltage Vin falls from "H" to "L," the NMOS 35 is changed from ON to OFF, and as the PMOS's 31 and 32 are ON, the node N32 is charged, and pulled up toward the power supply potential VDDH, and is thus changed from "L" to "H." As the node N32 is raised to "H," the PMOS's 32 and 34 are changed from ON to OFF, and the current, flowing from the power supply potential VDDH node, through the PMOS's 33 and 34, and the NMOS 36, to the ground potential VSS node, is interrupted.

Figure 2:
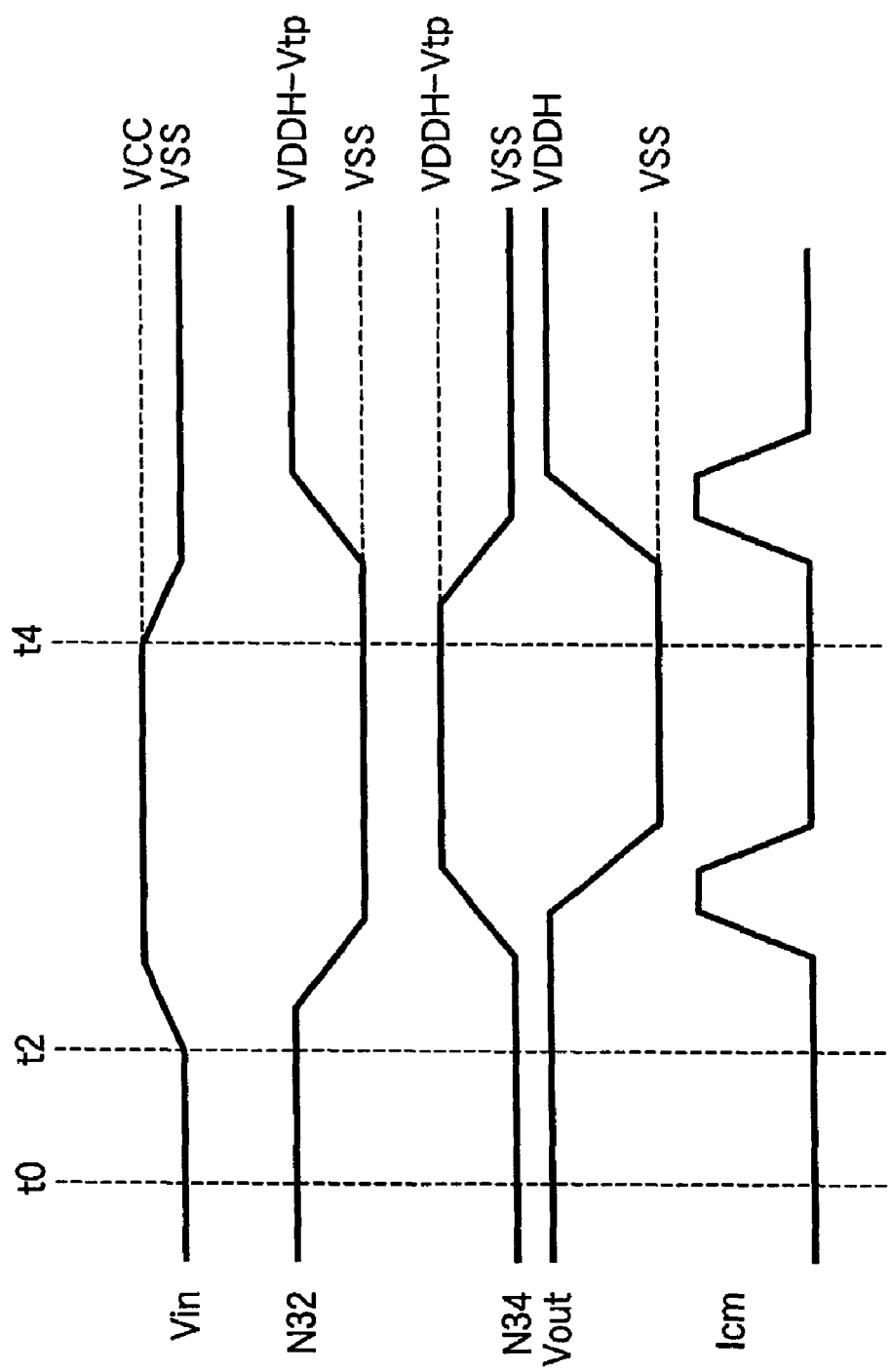
FIGS. 2A to 2E are timing charts showing the waveforms in various parts of FIG. 1.

The total current Icm through the current mirror circuit 30 is shown in FIG. 2E. When the input voltage Vin rises from "L" to "H," as in the period starting at time t2, the current flows through the PMOS's 31 and 32, and the NMOS 35, only until the cascode-connecte PMOS 31 is turned OFF. When the input voltage Vin falls from "H" to "L," as in the period starting at time t4, the current flows through the PMOS's 33 and 34, and the NMOS 36, only until the PMOS 34 is turned OFF.

The control means formed of the NMOS's 35 and 36 connects the first node (N32) to the ground potential VSS node (second power supply potential (VSS) node) set at the second power supply potential (VSS) level, when the potential at the second node (N34) is at the "H" level (first logic level), and disconnects the first node (N32) from the ground potential VSS node (second power supply potential (VSS) node), when the potential at the second node (N34) is at the "L" level (second logic level).

Advantages of the output circuit of Embodiment 1 over the conventional output circuit of FIG. 15 will be understood from the following description.

Figure 3:
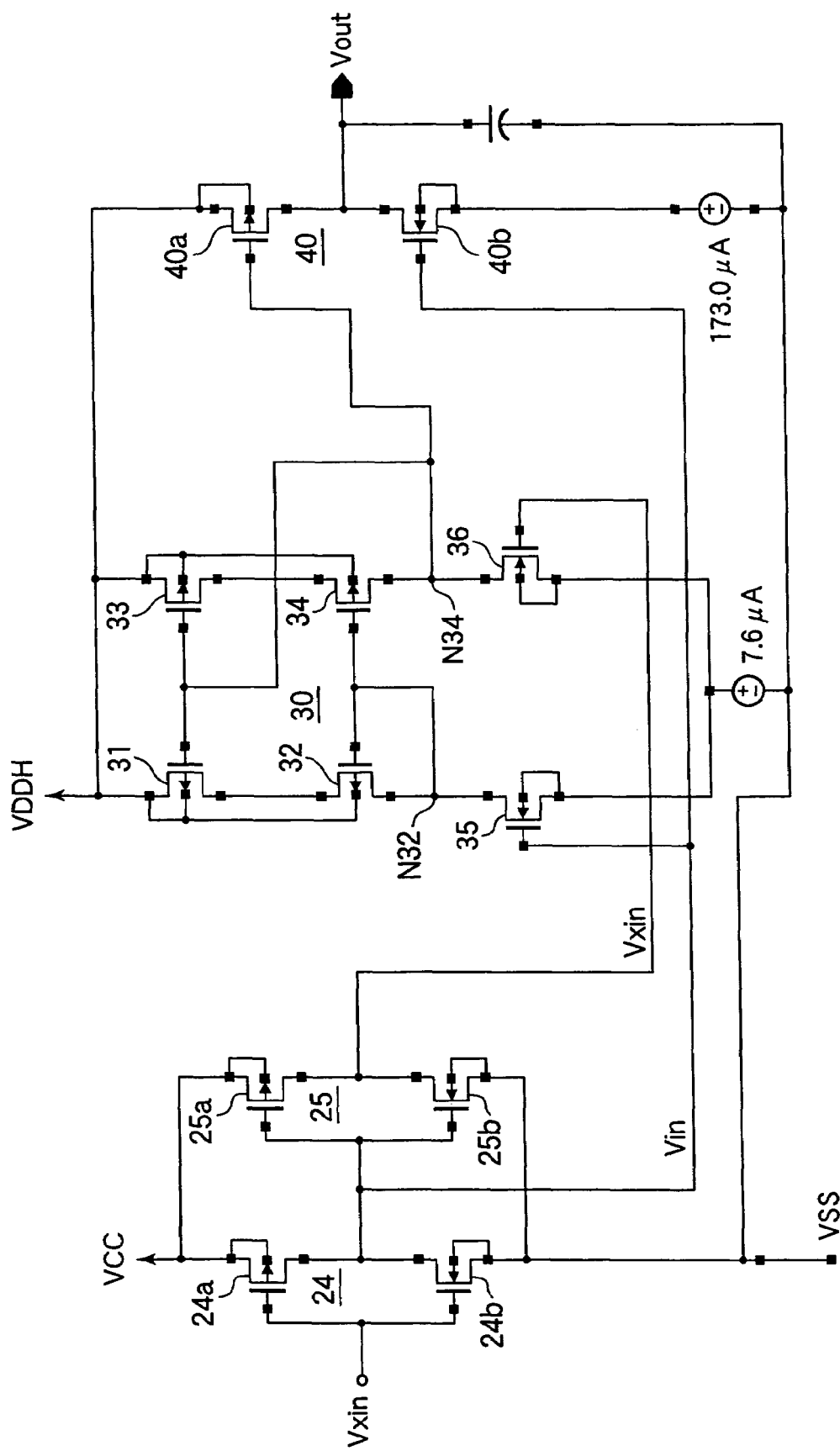
FIG. 3 is a diagram showing an output circuit used for simulation, corresponding to FIG. 1.
Figure 4:
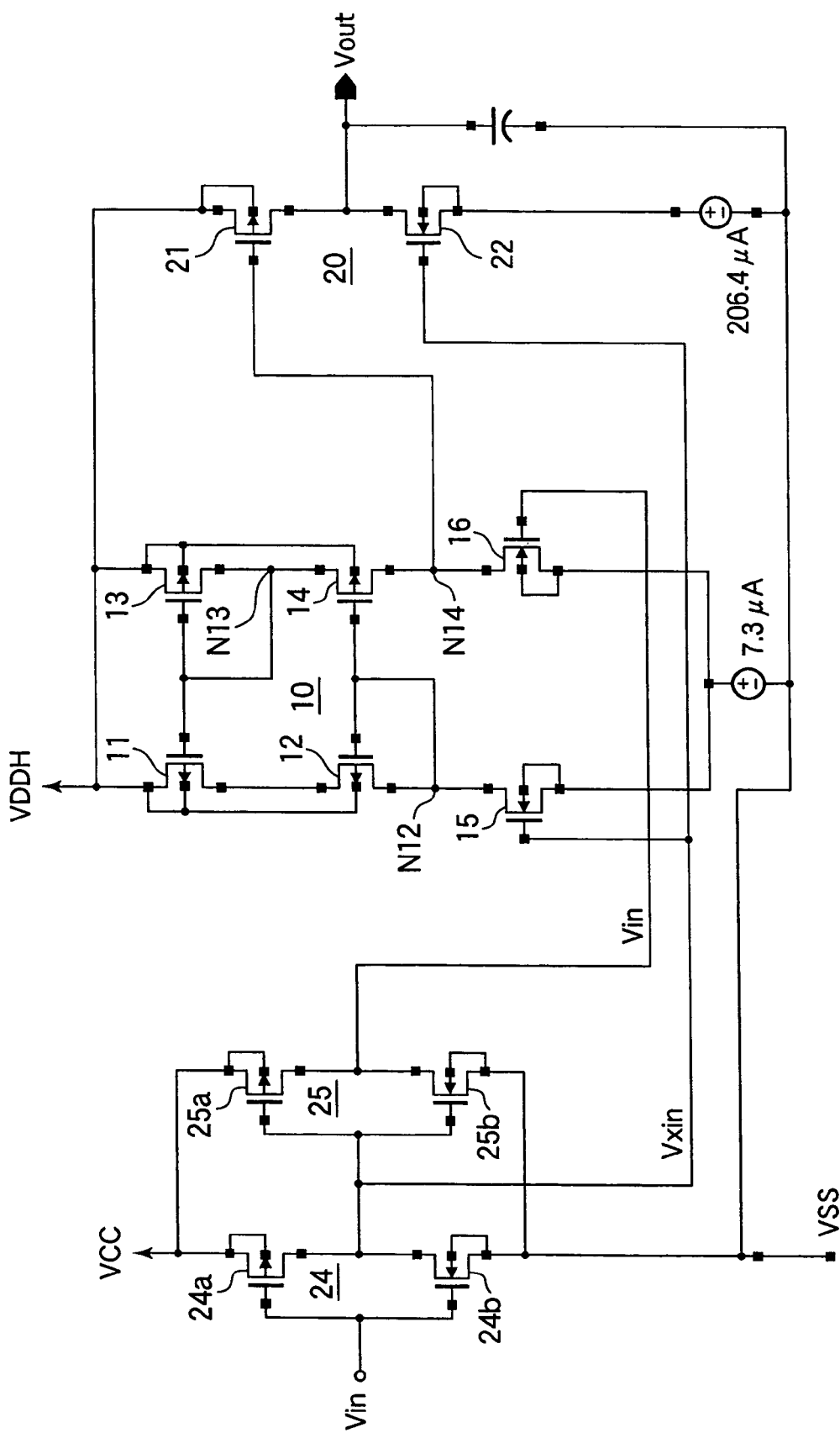
FIG. 4 is a diagram showing an output circuit used for simulation, corresponding to FIG. 15.

FIG. 3 and FIG. 4 show circuits used for simulation for the purpose of comparison between the output circuit of Embodiment 1 and the conventional output circuit of FIG. 15. The reference characters identical to those in FIG. 1 and FIG. 15 denote identical or corresponding elements or parts. FIG. 3 shows the circuit corresponding to the circuit of FIG. 1 according to Embodiment 1. FIG. 4 shows the circuit corresponding to the conventional circuit of FIG. 15.

An inverter 40 formed of a PMOS 40a and an NMOS 40b in the output stage 40 of the circuit of FIG. 3 is identical to the inverter 20 in FIG. 4, so that the simulation condition is identical to that of the circuit of FIG. 4. Moreover, in both of FIG. 3 and FIG. 4, the inverter 25 in the input stage is in the form of a complementary MOS (CMOS) inverter comprising a PMOS 25a and an NMOS 25b, and another CMOS inverter 24 comprising a PMOS 24a and an NMOS 24b is connected in front of the inverter 25.

FIGS. 5A to 7B show voltage waveforms showing the results of the simulation for the output circuit of FIG. 3 according to Embodiment 1, and the conventional circuit of FIG. 4. In FIGS. 5A to 7B, the horizontal axis represents the time, while the vertical axis represents the voltage 0 to 16V. The curves indicated by "E1" are the waveforms of output circuit according to Embodiment 1, while the curves indicated by "PA" are the waveforms of the conventional circuit.

Figure 5A:
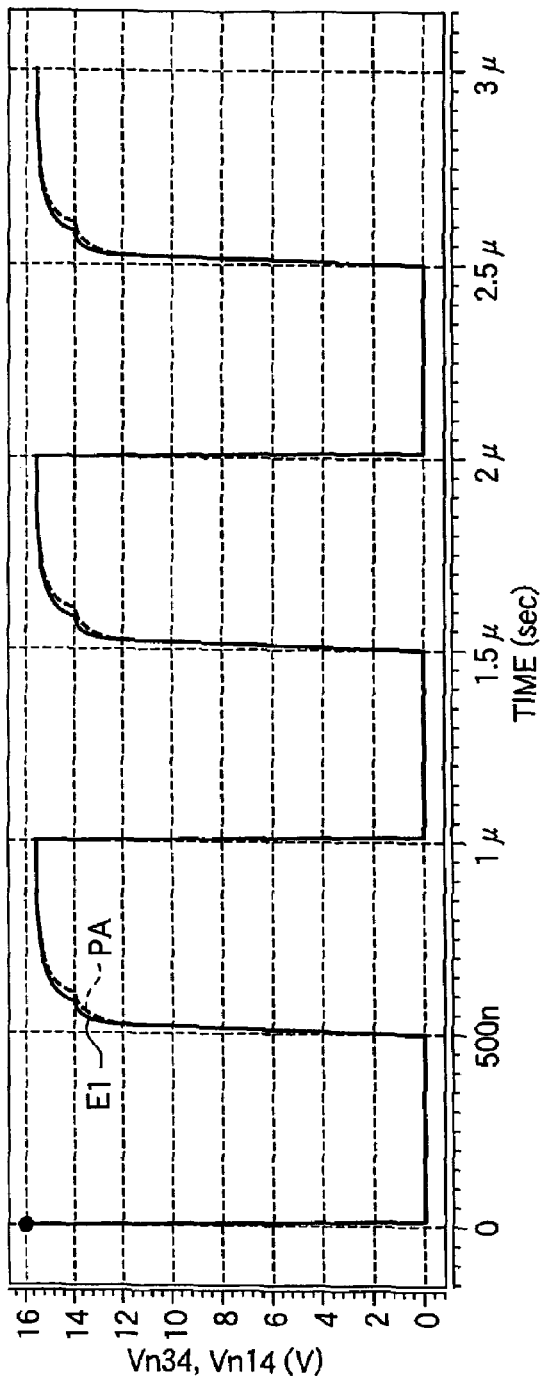
Figure 5B:
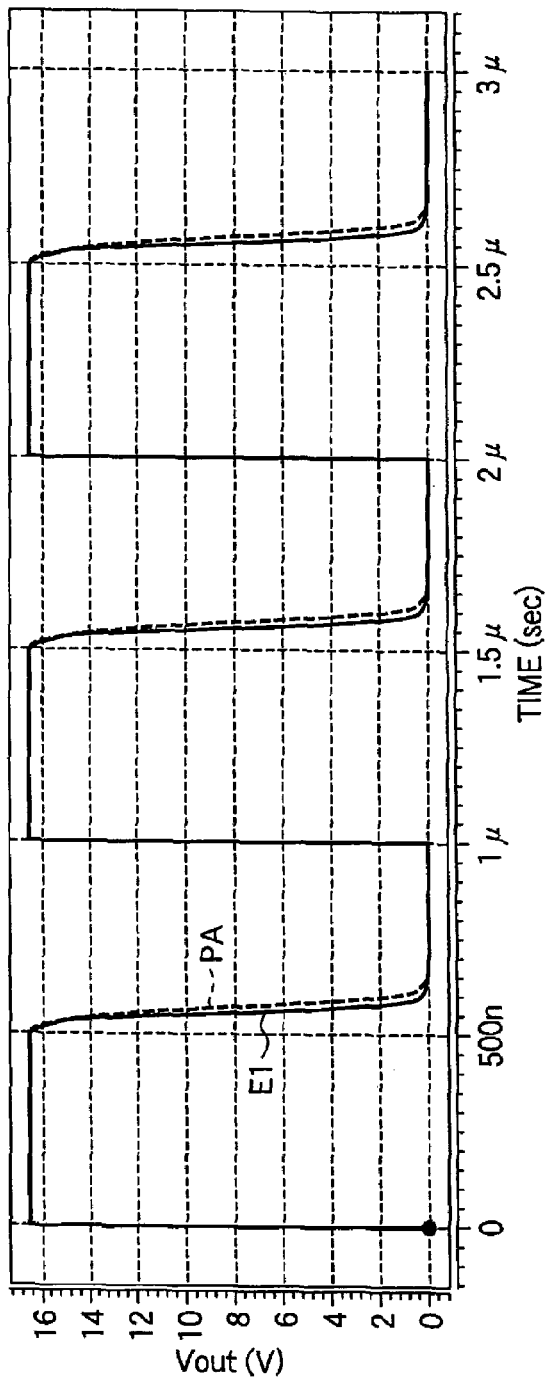
Figure 7A:
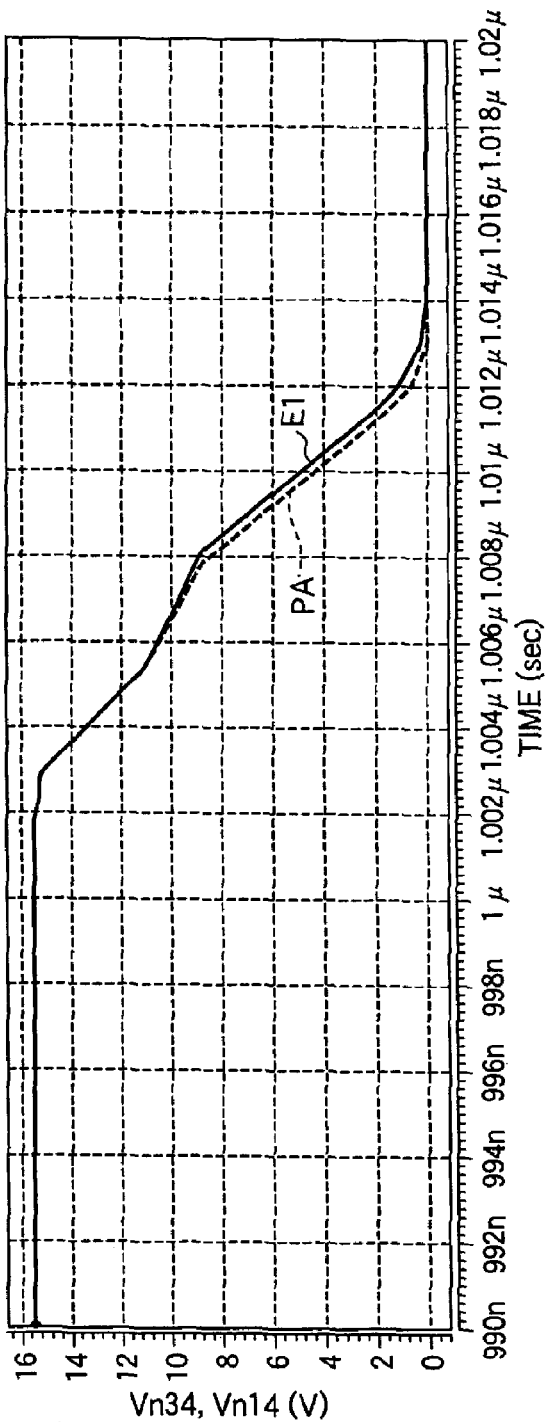
Figure 7B:
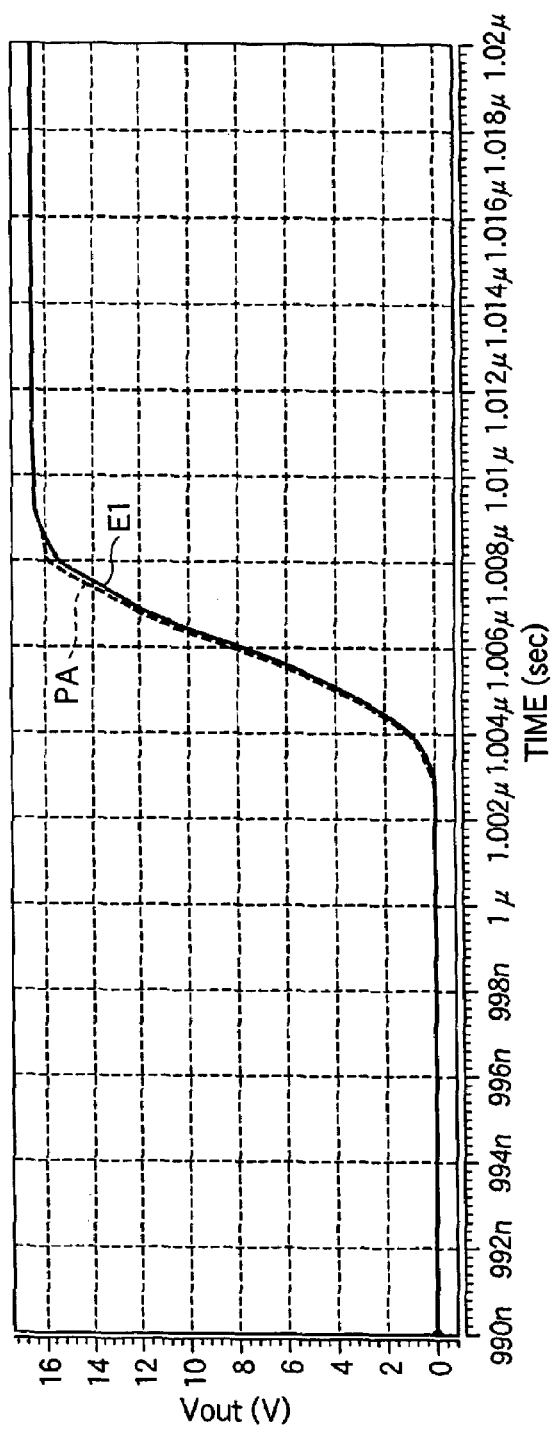

FIGS. 5A, 6A and 7A show the waveforms of the voltage Vn34 or Vn14 at the node N34 or N14, while FIGS. 5B, 6B and 7B show the waveforms of the voltage Vout at the output terminal OUT.

In FIGS. 5A and 5B, the horizontal axis represents the time ranging from 0 to 3 μsec. In FIGS. 6A and 6B, the horizontal axis represents the time ranging from 480 nsec to 640 nsec in FIGS. 5A and 5B, with the time axis being in a larger scale. In FIGS. 7A and 7B, the horizontal axis represents the time ranging from 990 nsec to 1.02 μsec in FIGS. 5A and 5B, with the time axis being in a larger scale.

When the circuit of FIG. 3 according to Embodiment 1 is compared with the conventional circuit of FIG. 4, there are the following differences (A1) to (A3).

(A1) In the circuit of Embodiment 1, the voltage at the node N34, which is the output part of the current mirror circuit 30 is input to the gates of the PMOS 31 and the PMOS 33, while in the conventional circuit, the voltage at the node N13 between the PMOS 13 and the PMOS 14 is input to the gates of the PMOS 11 and the PMOS 13. That is, the difference lies on whether the voltage input to the gates of the PMOS 31 or 11 and the PMOS 33 or 13 are supplied directly from the node N34 or N14, or via the PMOS 34 or 14.

(A2) Due to the difference at (A1) above, the rise time at the node N34 or N14 is shorter in the circuit according to Embodiment 1, than in the conventional circuit. The results of the simulation (FIG. 5A and FIG. 6A) show that the rise time is about 5 nsec shorter in the circuit of Embodiment 1 than in the conventional circuit.

(A3) Due to the difference in the rise time as discussed at (A2) above, the consumption current at the inverter 40 or 20 is smaller in the circuit of Embodiment 1, than in the conventional circuit. The results of the simulation (FIGS. 7A and 7B) show that:

(A3-1) the consumption current at the current mirror circuit 30 or 10 is larger in the circuit of Embodiment 1 than in the conventional circuit (see FIGS. 7A and 7B: the current flowing from the sources of the NMOS's 35 and 36 to the ground potential VSS node is 7.6 μA in the circuit of Embodiment 1, while the current flowing from the sources of the NMOS's 15 and 16 to the ground potential VSS node in the conventional circuit is 7.3 μA), but (A3-2) the consumption current in the output circuit as a whole is more than 10% smaller in the circuit of Embodiment 1 than in the conventional circuit (the current flowing from the NMOS 40b to the ground potential VSS node is 173.0 μA in the circuit of Embodiment 1, while the current flowing from the NMOS 22 to the ground potential VSS node in the conventional circuit is 206.4 μA).

The reason for (A3-1) noted above is that the consumption current at the node N34 is slightly increased due to the charging and discharging of the PMOS's 31 and 33 in the circuit of Embodiment 1. On the other hand, delays in the timing at which the MOS transistors are switched are smaller in the circuit of Embodiment 1 than in the conventional circuit.

This is because, in the circuit of Embodiment 1, when the NMOS 35 is turned ON, the node N32 is changed to "L," the PMOS's 32 and 34 are turned ON, and the potential at the node N34 becomes equal to VDDH-Vtp (Vtp is a threshold voltage of the PMOS), and the PMOS's 31 and 33 become slighly ON.

In contrast, in the conventional circuit, when the NMOS 15 is turned ON, the node N12 is changed to "L," and the PMOS's 12 and 14 are turned ON, and the potential at the node N14 becomes equal to VDDH-Vtp, and the PMOS's 11 and 13 become slightly ON.

For the reason set forth above, the delays in the switching timing of the MOS transistors is smaller in the circuit of Embodiment 1 than in the conventional circuit, and the difference in the delays depends on the ON resistance (resistance in ON state) of the PMOS 34 or 14. With a larger ON resistance, the difference in the switching delays becomes larger.

The reason for (A3-2) discussed above is that the delays in the switching of the MOS transistors are smaller in the circuit of Embodiment 1, than in the conventional circuit, and the consumption current at the inverter 40 or 20 in the output stage is smaller.

As has been described, according to the circuit of Embodiment 1, the delay in the rise of the node N34 is smaller, and the consumption current of the entire output circuit can be reduced.

Embodiment 2

Figure 8:
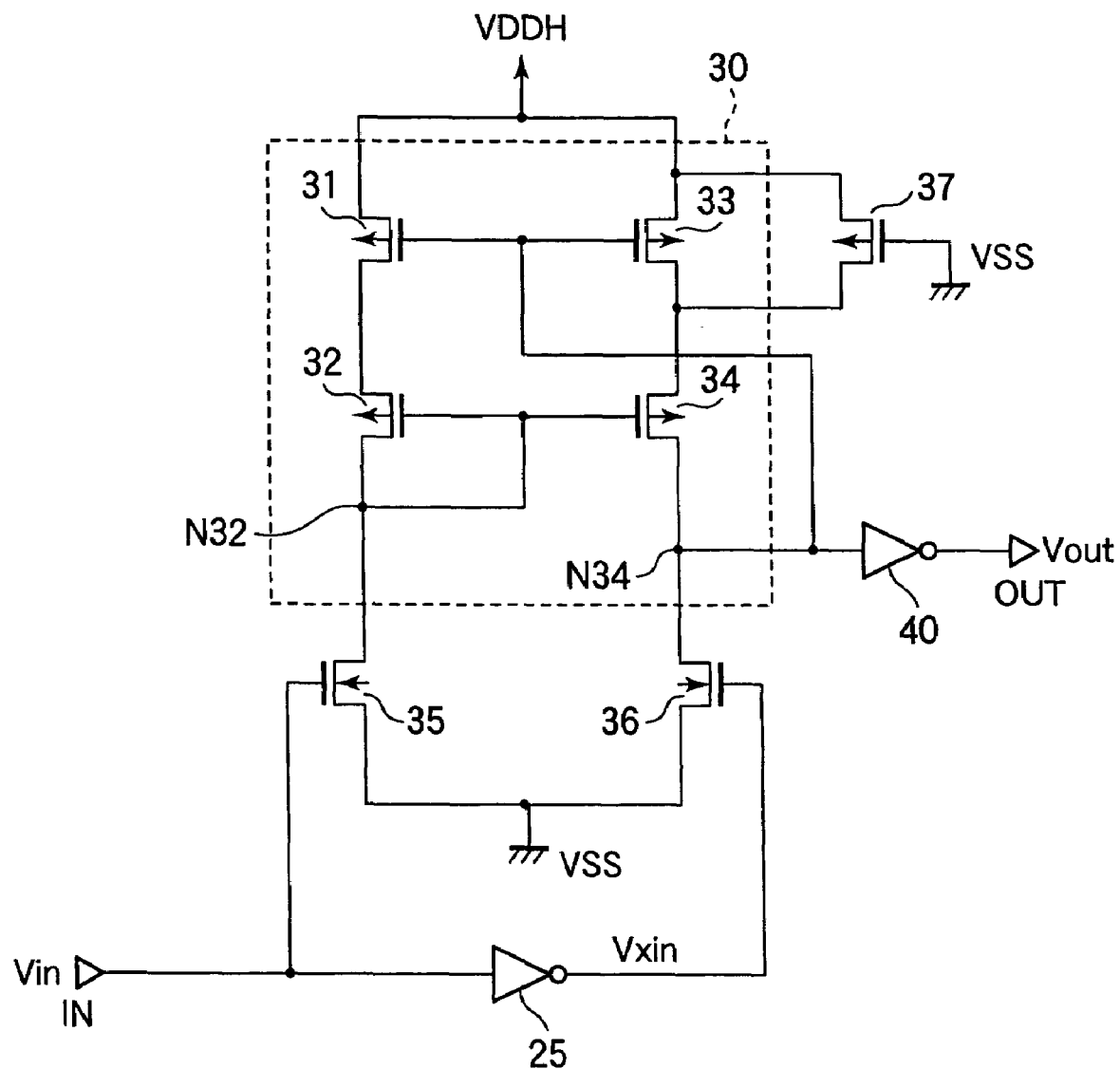
FIG. 8 is a circuit diagram showing an output circuit of Embodiment 2 of the present invention.
Figure 9:
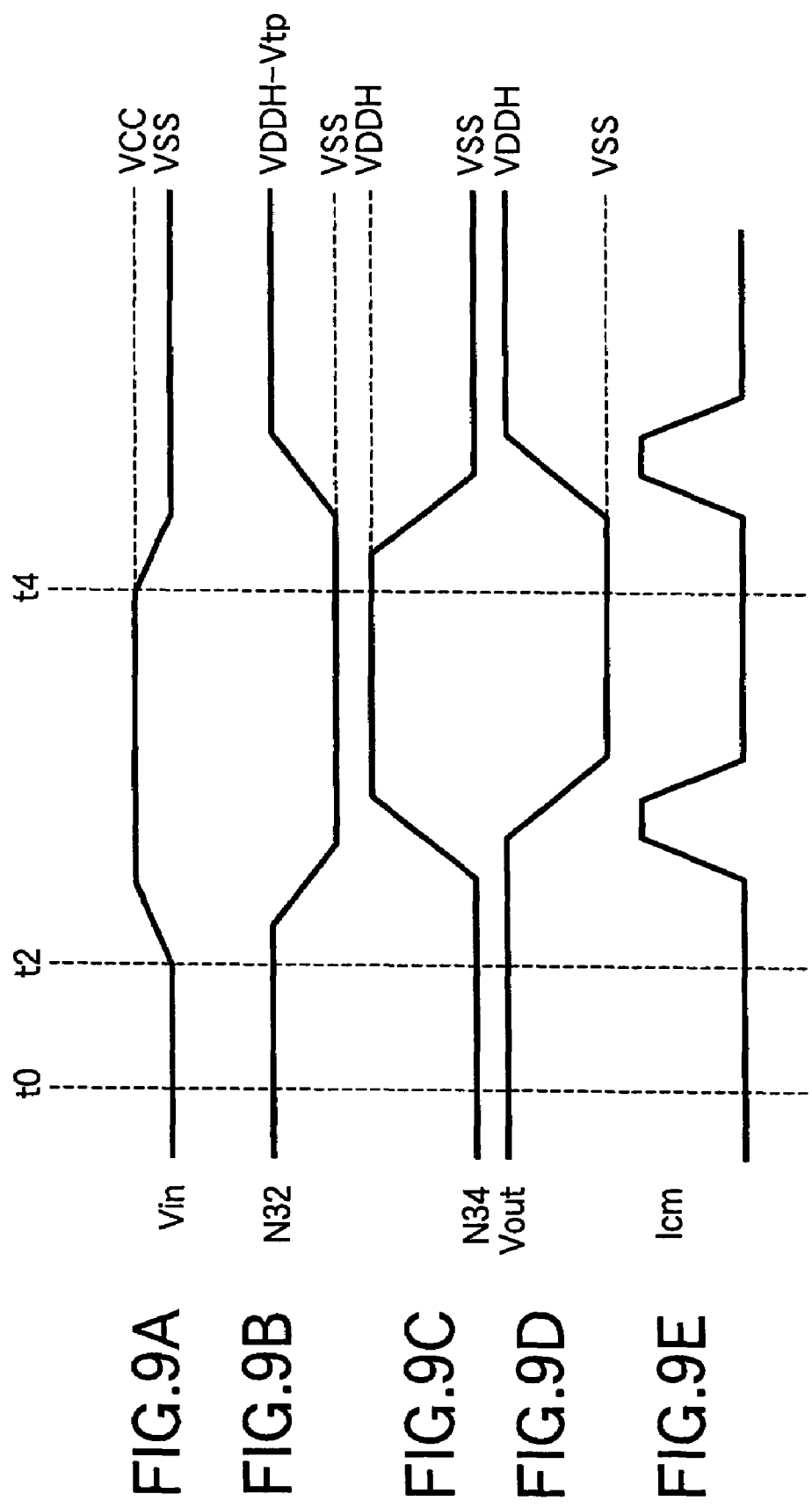
FIGS. 9A to 9E are timing charts showing the waveforms in various parts of FIG. 8.

FIG. 8 shows an output circuit of Embodiment 2 of the invention. The reference characters identical to those in FIG. 1 denote identical or similar elements. The circuit of FIG. 8 differs from the circuit of FIG. 1 in that a pull-up means 37 is connected in parallel with the PMOS 33. The pull-up means 37 in the illustrated example is formed of a normally-ON type PMOS. The gate of the PMOS 37 is connected to the ground potential VSS node, so as to make the PMOS 37 to be ON in the normal state. The rest of the configuration is identical to that of Embodiment 1.

FIGS. 9A to 9E are timing charts showing the operation of the circuit of FIG. 8.

The operation of the output circuit of Embodiment 2 is basically identical to that of Embodiment 1. However, because of the addition of the normally ON type PMOS 37, the potential at the node N34 rises to the power supply potential VDDH level when the input voltage Vin is "H." In contrast, in Embodiment 1, the voltage at the node N34 rises only up to the power supply potential VDDH minus the threshold voltage Vtp3 of the PMOS 33, i.e., (VDDH–Vtp3).

According to Embodiment 2, the node N34 is raised to the power supply potential VDDH when the input voltage Vin is changed to "H," so that even if the threshold voltage Vtp3 of the PMOS 33 is greater than the threshold voltage Vtpi of the PMOS 40a in the inverter 40 (Vtp3>Vtpi), no through current flows through the inverter 40. In contrast, in Embodiment 1, if Vtp3>Vtpi, the PMOS 40a in the inverter 40 is not in the OFF state, but is slighly ON, so that a through current flows, and, as a result, the consumption current is larger than in Embodiment 2.

Figure 16:
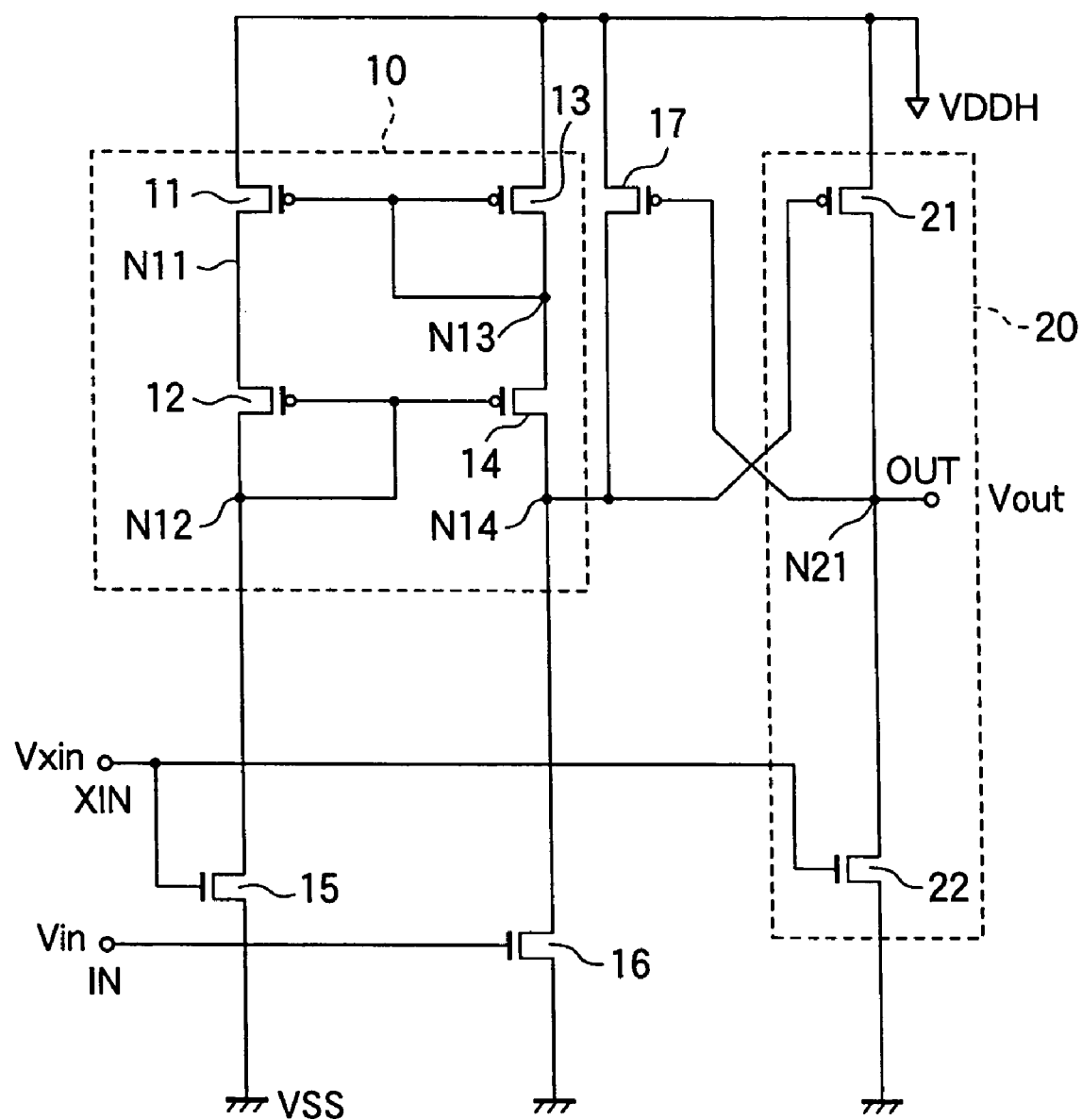
FIG. 16 is a circuit diagram showing another conventional output circuit.

In addition, the advantages of the output circuit of Embodiment 2 over the conventional output circuit of FIG. 16 will be understood from the following description.

Figure 10:
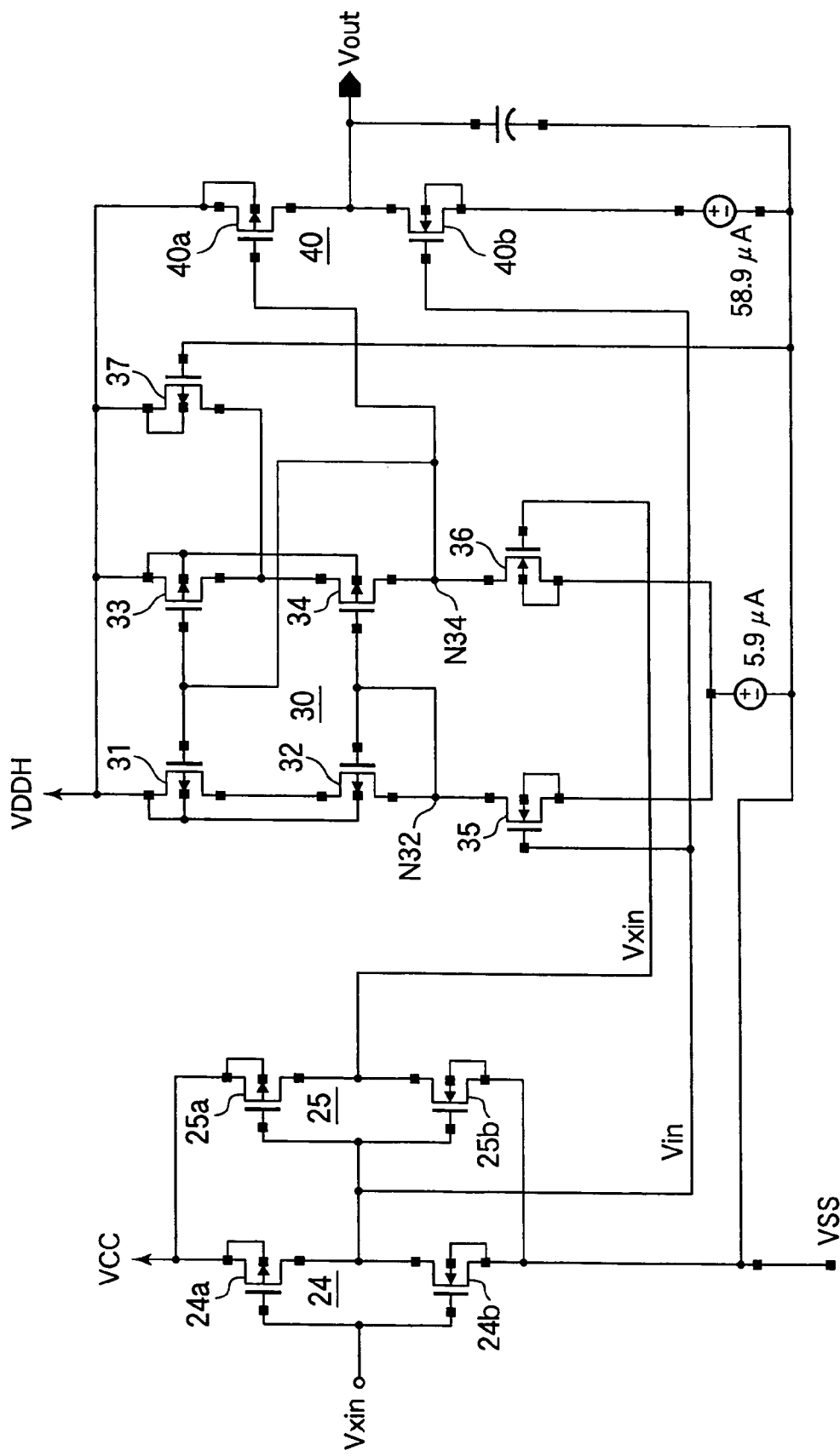
FIG. 10 is a diagram showing an output circuit used for simulation, corresponding to FIG. 8.
Figure 11:
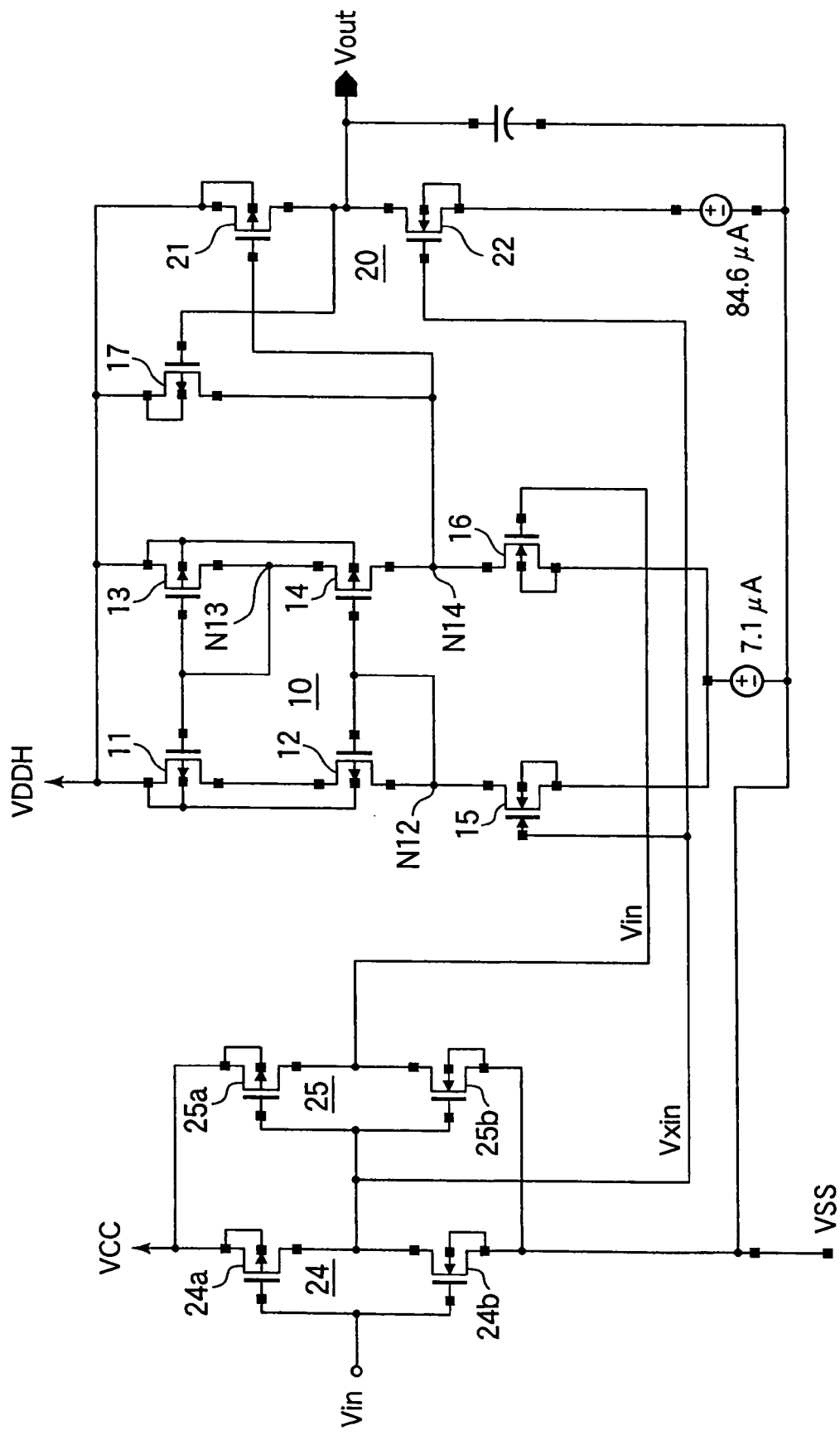
FIG. 11 is a diagram showing an output circuit used for simulation, corresponding to FIG. 16.

FIGS. 10 and 11 correspond to FIGS. 3 and 4, and show circuits used for simulation for the purpose of comparison between the output circuit of Embodiment 2 and the conventional circuit of FIG. 16. The reference characters identical to those in FIG. 8 and FIG. 16 denote identical or corresponding elements or parts. FIG. 10 shows the circuit corresponding to the circuit of FIG. 8. FIG. 11 shows the circuit corresponding to the conventional circuit of FIG. 16.

As was also discussed in connection with FIGS. 3 and 4, an inverter 40 formed of a PMOS 40a and an NMOS 40b in the output stage 40 of the circuit of FIG. 10 is identical to the inverter 20 in FIG. 11, so that the simulation condition is identical to that of the circuit of FIG. 11. Moreover, in both of FIG. 3 and FIG. 4, the inverter 25 in the input stage is in the form of a complementary MOS (CMOS) inverter comprising a PMOS 25a and an NMOS 25b, and another CMOS inverter 24 comprising a PMOS 24a and an NMOS 24b is connected in front of the inverter 25.

FIGS. 12A to 14B show voltage waveforms showing the results of the simulation for the output circuit of FIG. 10 according to Embodiment 2, and the conventional circuit of FIG. 11. In FIGS. 12A to 14B, the horizontal axis represents the time, while the vertical axis represents the voltage 0 to 16V. The curves indicated by "E2" are the waveforms of output circuit according to Embodiment 2, while the curves indicated by "PA" are the waveforms of the conventional circuit.

Figure 12A:
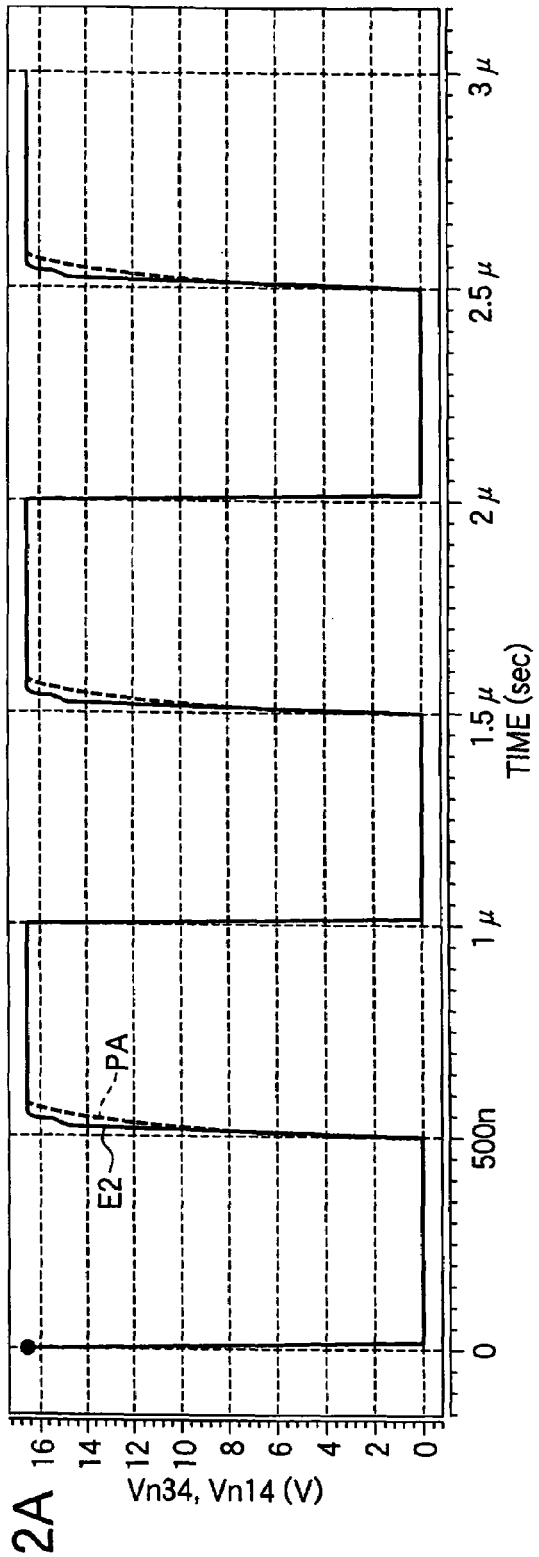
Figure 12B:
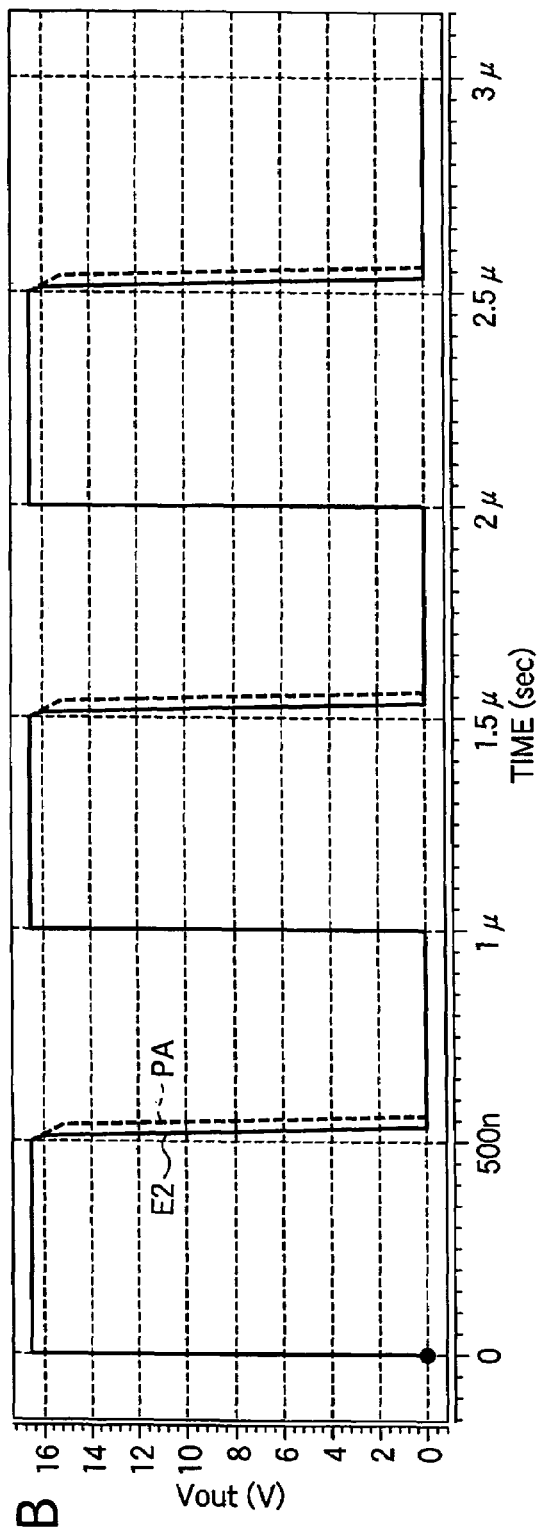
Figure 13A:
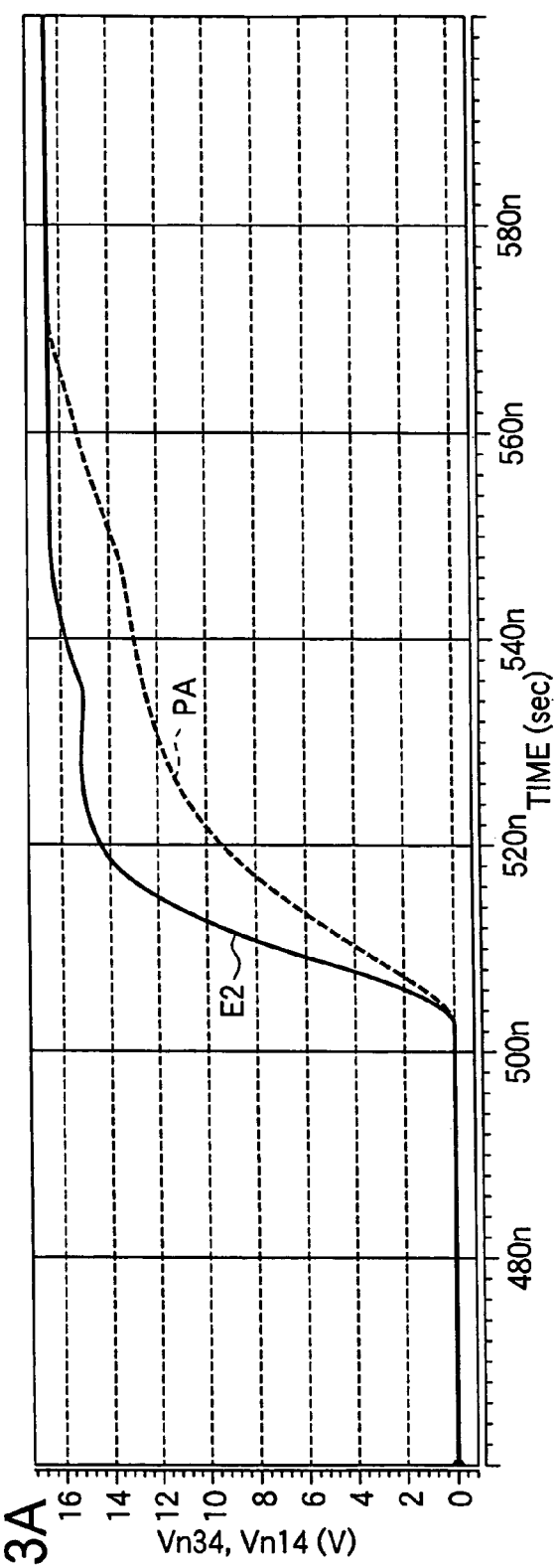
Figure 13B:
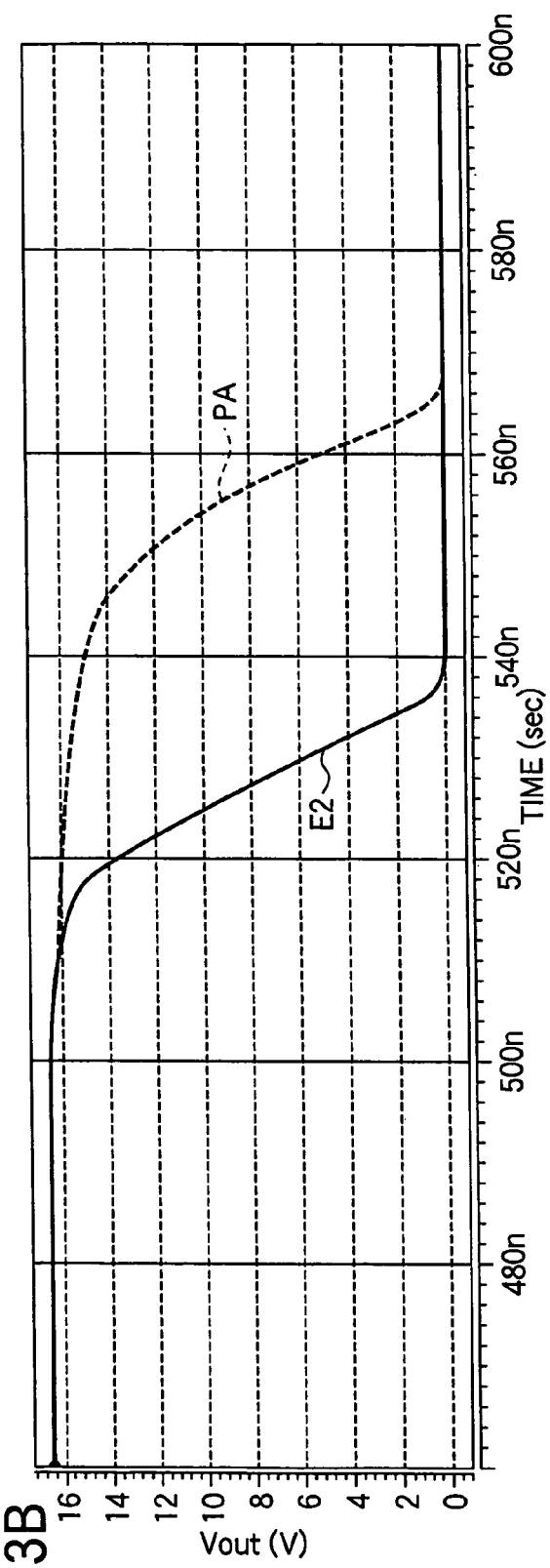

FIGS. 12A, 13A and 14A show the waveforms of the voltage Vn34 or Vn14 at the node N34 or N14, while FIGS. 12B, 13B and 14B show the waveforms of the voltage Vout at the output terminal OUT.

In FIGS. 12A and 12B, the horizontal axis represents the time ranging from 0 to 3 μsec. In FIGS. 13A and 13B, the horizontal axis represents the time ranging from 460 nsec to 600 nsec in FIGS. 12A and 12B, with the time axis being in a larger scale. In FIGS. 14A and 14B, the horizontal axis represents the time ranging from 960 nsec to 1.06 μsec in FIGS. 12A and 12B, with the time axis being in a larger scale.

When the circuit of FIG. 10 according to Embodiment 2 is compared with the conventional circuit of FIG. 11, there are the following differences (B1) to (B3).

(B1) The circuit of Embodiment 2 and the conventional circuit are identical in that both uses a PMOS 37 or 17 for the purpose of pulling-up to raise the output voltage from the current mirror circuit 30 or 10 to the power supply potential VDDH, but they use different circuit configurations. That is, the normally-ON type PMOS 37, with its gate controlled to the ground potential VSS node, is connected in parallel with the PMOS 33 in Embodiment 2, while the PMOS 17 controlled by the output signal Vout is connected in parallel with a series connection of the PMOS's 13 and 14.

(B2) Due to the difference at (B1) above, the rise time at the node N34 (corresponding to N14) is shorter by about 20 nsec in the circuit according to Embodiment 2, than in the conventional circuit. The results of the simulation (FIG. 12A and FIG. 13A) show that the rise time is about 20 nsec shorter in the circuit of Embodiment 2 than in the conventional circuit.

(B3) Due to the difference in the rise time as discussed at (B2) above, the consumption current at the current mirror circuit 30 or 10, and the consumption current at the inverter 40 or 20 are both smaller in the circuit of Embodiment 2 than in the conventional circuit. That is, in the circuit of Embodiment 2, the consumption current at the current mirror circuit 30 (the current flowing from the sources of the NMOS's 35 and 36 to the ground potential VSS node) is 5.9 μA, and the consumption current of the inverter 40 in the output stage (the current flowing from the source of the NMOS 40b to the ground potential VSS node) is 58.9 μA, while in the conventional circuit, the consumption current at the current mirror circuit 10 (the current flowing from the sources of the NMOS's 15 and 16 to the ground potential VSS node) is 7.1 μA, and the consumption current at the inverter 20 in the output stage (the current flowing from the source of the NMOS 22 to the ground potential VSS node) is 84.6 μA.

The reason for the difference is as follows: In the circuit of Embodiment 2, when the NMOS 35 is turned ON, the node N32 goes "L," and the PMOS's 32, and 34 are turned ON, and the potential on the node N34 is changed to VDDH, so that the PMOS's are turned OFF.

In contrast, in the conventional circuit, when the NMOS 15 is turned ON, the node N12 goes "L," and the PMOS's 12 and 14 are turned ON, and the node N14 goes "L," and the PMOS's 11 and 13 are turned ON, and the voltage on the node N14 is changed to VDDH-Vtp, and the PMOS 21 is turned OFF, and the output terminal OUT goes "L," and the PMOS 17 is turned ON, and the voltage on the node N14 is changed to VDDH, and the PMOS's 11 and 13 are turned OFF.

The comparison of the time taken for the potential on the node N34 or N14 up to the power supply potential VDDH level is as follows:

In the conventional circuit, when the potential on the node N14 is raised to VDDH-Vtp, the PMOS 21 is turned OFF, the output terminal OUT goes "L," and the PMOS 17 is turned ON, and the potential on the node N14 is changed to VDDH. Thus, the conventional circuit requires an additional transition time which is not required by the circuit of Embodiment 2. The circuit of Embodiment 2 therefore operates at a higher speed.

In the conventional circuit, during the transition time, the PMOS's 11 and 13 are slightly ON, up to the time when the PMOS 21 is turned FF, and the PMOS 17 are turned ON, so that a current flows through the path including the node N12. The consumption current in the current mirror circuit 10 is therefore larger than in the circuit of Embodiment 2.

Moreover, in the conventional circuit, because of the effect of the PMOS 17, there is a delay in the rise of the inverter 20, and accordingly, the fall of the inverter is also delayed by the time taken for the reversal. As a result, the through current flowing through the inverter 20 is larger than in the circuit of Embodiment 2.

The overall consumption current is larger in the conventional circuit than in the circuit of Embodiment 2.

The invention is not limited to Embodiments 1 and 2 having been described, but various modifications are possible, as exemplified at (C1) to (C3) below.

(C1) In the circuit of FIG. 8, a normally-ON type PMOS 37 is used to pull up the potential at the node N34, to the power supply potential VDDH, but any other pull-up means such as a resistor may be used instead.

(C2) In Embodiments 1 and 2, description is made of the voltage conversion in the positive direction, such as the conversion of the input voltage Vin which assumes either 0 V or 5 V to an output voltage Vout which assumes either 0 V or 16V. By replacing the PMOS's in the circuits of Embodiments 1 and 2, with NMOS's, and replacing the NMOS's in the circuits of Embodiments 1 and 2, with PMOS's, and reversing the order of connection (from a higher potential power supply node to a lower potential power supply node of the respective elements, it is possible to realize an output circuit for voltage conversion in the negative direction, e.g., for converting an input signal which assumes either 0V or −5 V, to an output voltage which assumes either 0 V or −16 V.

Moreover, the PMOS's and NMOS's in the circuit of the Embodiment 1 and 2 may be replaced by bipolar transistors. In such a case, the base of each bipolar transistor constitutes the control gate, the collector and emitter constitute the first and second main electrodes.

(C3) In the circuit of Embodiment 1s and 2, the inverter 25 in the input stage may be replaced with two-stage inverters 24 and 25, as shown in FIGS. 3 and 10, and the inverter 40 may be in the form of the configuration comprising a PMOS 40a and an NMOS 40b as shown in FIGS. 3 and 10, and yet results similar to those of Embodiment 1 and 2 can be obtained.

What is claimed is:

1. An output circuit comprising:
a first circuit having first and second transistors connected in series between a first power supply potential node set at a first power supply potential level, and a first node, said first transistor having a control electrode directly connected to a second node that is an output node of the output circuit, so that a conduction state of said first transistor is controlled by a potential at said second node; and
a second circuit having third and fourth transistors connected in series between said first power supply potential node, and said second node, said first and second circuits configured together as a current mirror circuit, said second transistor being so connected that a conduction state of said second transistor is controlled by a potential at said first node, said third transistor having a control electrode directly connected to said second node so that a conduction state of said third transistor is controlled by the potential at said second node, and said fourth transistor being so connected that a conduction state of said fourth transistor is controlled by the potential at said first node.

2. The output circuit according to claim 1, wherein when the potential at said first node is at a first logic level, said second and fourth transistors are non-conductive;

when the potential at said first node is at a second logic level, said second and fourth transistors are conductive, when the potential at said second node is at said first logic level, said first and third transistors are non-conductive; and when the potential at said second node is at said second logic level, said first and third transistors are conductive.

3. The output circuit according to claim 1, further comprising a controller that connects said first node to a second power supply potential node set at a second power supply potential level when the potential at said second node is at a first logic level, and that disconnects said first node from said second power supply potential node when the potential at said second node is at a second logic level.

4. The output circuit according to claim 3, wherein said controller comprises:

a fifth transistor connected between said first node and said second power supply potential node, and so connected that a conduction state of said fifth transistor is controlled by a first input signal; and a sixth transistor connected between said second node and said second power supply potential node, and so connected that a conduction state of said sixth transistor is controlled by a second input signal complementary to said first input signal.

5. The output circuit according to claim 3, further comprising a buffer, connected to said second node, that receives the potential at said second node and outputs an output signal.

6. The output circuit according to claim 5, wherein said buffer comprises a complementary inverter comprising a transistor of a first conductivity type, and a transistor of a second conductivity type connected in series with said transistor of said first conductivity type.

7. The output circuit according to claim 5, wherein said buffer comprises a transistor of a first conductivity type having a conduction state controlled by the potential at said second node, and a transistor of a second conductivity type connected in series with said transistor of said first conductivity type and having a conduction state controlled by an input signal.

8. The output circuit according to claim 3, further comprising a pull-up element connected in parallel with said third transistor.

9. The output circuit according to claim 8, wherein said pull-up element comprises a transistor connected to be held in an always ON-state, or a resistive element.

10. The output circuit according to claim 1, wherein said first to fourth transistors are p-channel MOS transistors, and when a potential at said second node rises to a high logic level, the first and third transistors are made non-conductive by the potential at said second node, and when the potential at said second node falls to a low logic level, the first and third transistors are made conductive by the potential at said second node.

11. An output circuit comprising:

a first transistor having a first main electrode, a second main electrode, and a control electrode, said first main electrode of said first transistor being connected to a first power supply potential node set at a first power supply potential level;

a second transistor having a first main electrode, a second main electrode, and a control electrode, said first main electrode of said second transistor being connected to said second main electrode of said first transistor, and said second main electrode and said control electrode of said second transistor being connected to a first node;

a third transistor having a first main electrode, a second main electrode, and a control electrode, said first main electrode of said third transistor being connected to said first power supply potential node, said control electrode of said third transistor being connected to said control electrode of said first transistor; and a fourth transistor having a first main electrode, a second main electrode and a control electrode, said first main electrode of said fourth transistor being connected to said second main electrode of said third transistor, said second main electrode of said fourth transistor being connected to a second node that is an output node of the output circuit, and said control electrode of said fourth transistor being connected to said control electrode of said second transistor, wherein said first, second, third and fourth transistors as connected are a current mirror circuit, and wherein said control electrode of said first transistor and said control electrode of said third transistor are directly connected via a signal line to said second node.

12. The output circuit according to claim 11, wherein when a potential of said first node is at a first logic level, said second and fourth transistors are non-conductive;

when the potential of said first node is at a second logic level, said second and fourth transistors are conductive;

when a potential of said second node is at said first logic level, said first and third transistors are non-conductive; and when the potential of said second node is at said second logic level, said first and third transistors are conductive.

13. The output circuit according to claim 11, further comprising a controller that connects said first node to a second power supply potential node set at a second power supply potential level when a potential of said second node is at a first logic level, and disconnecting said first node from said second power supply potential node when the potential of said second node is at a second logic level.

14. The output circuit according to claim 13, wherein said controller comprises:

a fifth transistor connected between said first node and said second power supply potential node, and so connected that a conduction state of said fifth transistor is controlled by a first input signal, and a sixth transistor connected between said second node and said second power supply potential node, and so connected that a conduction state of said sixth transistor is controlled by a second input signal complementary to said first input signal.

15. The output circuit according to claim 13, further comprising a buffer, connected to said second node, that receives the potential of said second node and outputs an output signal.

16. The output circuit according to claim 15, wherein said buffer comprises a complementary inverter comprising a transistor of a first conductivity type, and a transistor of a second conductivity type connected in series with said transistor of said first conductivity type.

17. The output circuit according to claim 15, wherein said buffer comprises a transistor of a first conductivity type having a conduction state controlled by the potential of said second node, and a transistor of a second conductivity type connected in series with said transistor of said first conductivity type and having a conduction state controlled by an input signal.

18. The output circuit according to claim 13, further comprising a pull-up element connected in parallel with said third transistor.

19. The output circuit according to claim 18, wherein said pull-up element comprises a transistor connected to be held in an always ON-state, or a resistive element.

20. The output circuit according to claim 11,
wherein said first to fourth transistors are p-channel MOS transistors, and
when a potential at said second node rises to a high logic level, the first and third transistors are made non-conductive by the potential at said second node, and
when the potential at said second node falls to a low logic level, the first and third transistors are made conductive by the potential at said second node.

* * * * *